(12) United States Patent
Wan et al.

(10) Patent No.: US 8,634,229 B2
(45) Date of Patent: Jan. 21, 2014

(54) DYNAMIC MEMORY CELL PROVIDED WITH A FIELD-EFFECT TRANSISTOR HAVING ZERO SWING

(71) Applicants: Commissariat a l'Energie Atomique et aux Energies Alternatives, Paris (FR); Centre National de la Recherche Scientifique, Paris (FR)

(72) Inventors: Jing Wan, Grenoble (FR); Sorin Cristoloveanu, Seyssinet Pariset (FR); Cyrille Le Royer, Tullins-Fures (FR); Alexander Zaslavsky, Providence, RI (US)

(73) Assignees: Commissariat a l'Energie Atomique et aux Energies Alternatives, Paris (FR); Centre National de Recherche Scientifique, Paris (FR)

( * ) Notice: Subject to any disclaimer, the term of this patent is extended or adjusted under 35 U.S.C. 154(b) by 0 days.

(21) Appl. No.: 13/657,537

(22) Filed: Oct. 22, 2012

(65) Prior Publication Data
US 2013/0100729 A1    Apr. 25, 2013

(30) Foreign Application Priority Data
Oct. 21, 2011  (FR) .................................. 11 03232

(51) Int. Cl.
*G11C 11/24*  (2006.01)

(52) U.S. Cl.
USPC ........... 365/149; 365/150; 257/256; 257/255; 257/E27.148

(58) Field of Classification Search
USPC .......... 365/149, 150; 257/255, 256, 365, 366, 257/E27.148, E29.179; 438/283
See application file for complete search history.

(56) References Cited

U.S. PATENT DOCUMENTS

| 7,759,175 B2 * | 7/2010 | Clavelier et al. .............. 438/149 |
| 8,369,134 B2 * | 2/2013 | Singh et al. ................... 365/154 |
| 2006/0113612 A1 | 6/2006 | Gopalakrishnan et al. |

(Continued)

FOREIGN PATENT DOCUMENTS

EP    1 901 354 A1    3/2008

OTHER PUBLICATIONS

Cho et al., "A novel capacitor-less DRAM cell using Thin Capacitively-Coupled Thyristor (TCCT)," *International Electron Devices Meeting 5*, 2005, pp. 311-314.

(Continued)

*Primary Examiner* — Harry W Byrne
*Assistant Examiner* — Lance Reidlinger
(74) *Attorney, Agent, or Firm* — Oliff & Berridge, PLC

(57) ABSTRACT

A memory cell is provided with a transistor which includes source and drain electrodes formed in a semiconductor film by respectively N-doped and P-doped areas. The transistor includes first and second devices for generating a potential barrier in the semiconductor film. The two potential barriers are shifted laterally and are opposed to the passage of the charge carriers emitted by the nearest source/drain electrode. One of the devices for generating the potential barrier is electrically connected to the gate. The other of the devices for generating the potential barrier is electrically connected to the counter-electrode. The writing of a high state is carried out by imposing on the P-doped electrode a potential higher than that of the N-doped electrode and charging the capacitor formed between the gate and the semiconductor film. The resetting of the memory cell is obtained by discharging the capacitor.

9 Claims, 6 Drawing Sheets

(56) References Cited

U.S. PATENT DOCUMENTS

2008/0029781 A1    2/2008  Nguyen et al.
2009/0001472 A1    1/2009  Salman et al.
2013/0069122 A1*   3/2013  Wan et al. .................... 257/256

OTHER PUBLICATIONS

Yang et al., "Scaling of the SOI Field Effect Diode (FED) for Memory Application," *Semiconductor Device Research Symposium*, 2009.

Padilla et al., "Feedback FET: A Novel Transistor Exhibiting Steep Switching Behavior at Low Bias Voltages," *IEEE International Delectron Devices Meeting*, 2008.

Manavizadeh et al., "A Comprehensive Study of Nanoscale Field Effect Diodes," *12th International Conference on Thermal, Mechanical and Multiphysics Simulation and Experiments in Microelectronics and Microsystems*, EuroSimE, 2011, pp. 1-4.

* cited by examiner

DYNAMIC MEMORY CELL PROVIDED WITH A FIELD-EFFECT TRANSISTOR HAVING ZERO SWING

TECHNICAL FIELD OF THE INVENTION

The invention relates to a dynamic memory cell comprising a field-effect transistor.

STATE OF THE ART

Progressively with the technological developments, the level of integration in integrated circuits has become higher and higher in a continuous way, which enables to incorporate a more and more significant number of electronic functions for a given silicon surface.

As there are more and more functionalities in the integrated circuits, a more and more significant quantity of memory cells are embedded in electronic cells. In order to further increase the level of integration in the integrated circuits, the architectures of the memory cells are modified at each technological node for decreasing the occupied surface.

The densest dynamic memory cells are of the 1T-DRAM type. These memory cells are made by using a transistor which is able to keep electric charges therein. These electric charges have an effect on the electric characteristics of the transistor which makes it possible to define a high state and a low state. In a conventional way, this category of capacitor-less memory cell is obtained by using NMOS transistors of the type silicon on an insulator. For this kind of memory cell, the majority charge carriers (holes in the case of NMOS transistors) are injected into the neutral area of the floating substrate. These charge carriers, confined in an area bordered by the buried oxide, the gate oxide and the source and drain junctions, accumulate in the floating substrate and modify the potential thereof. In the case of a NMOS transistor, this increase in potential is linked to the current of the junction between the source and the floating substrate. Thus, the introduction of the charges into the floating substrate makes it possible to reduce the threshold voltage of the transistor. The drain current is amplified. In this case, the floating substrate is used as a holding area of a memory charge. This memorized charge (state 1 of the memory) can be evacuated by directly biasing the drain/substrate junction. State 0 of the memory corresponds to an absence of charge in the floating substrate.

In these memory cells of the 1T-DRAM type, creating charges is carried out by impact ionization or by "band to band tunneling", which allows the accumulation of a great quantity of holes. Generally, the charge carriers are injected into these memory cells by means of a high electric field which is detrimental to the reliability of the devices.

It is necessary then to find solutions which make it possible to form memory cells having a high integration density and good time characteristics.

OBJECT OF THE INVENTION

It is noted that there is a need for proposing a memory cell comprising a field-effect transistor whose reliability is improved. For this purpose, one seeks a memory cell according to the annexed claims and more particularly a memory cell comprising:
a field-effect transistor comprising:
  a first source/drain electrode by a first N-doped area formed in a film made of a semiconductor material,
  a second source/drain electrode by a second P-doped area formed in a film made of the semiconductor material,
  an inter-electrode area formed in the film made of the semiconductor material and separating the two source/drain electrodes,
  a gate electrode covering, at least partially, the inter-electrode area,
a first generator for generating a first potential barrier in the semiconductor film, the first potential barrier being opposed to the passage of charge carriers emitted by the first source/drain electrode,
a second generator for generating a second potential barrier in the semiconductor film, the second potential barrier being opposed to the passage of charge carriers emitted by the second source/drain electrode, the second potential barrier being shifted from the first potential barrier with respect to an axis connecting the two source/drain electrodes, one of the generators for generating a potential barrier being configured so as to generate a potential barrier having a variable amplitude and being electrically connected to the gate electrode,
a circuit for applying a first potential difference between the first source/drain electrode and the second source/drain electrode configured to bias the P-doped electrode at a potential higher than that of the N-doped electrode,
a control circuit configured so as to:
  switching the transistor into an on-state then into an off-state in order to write a state into the memory cell by charging the capacitor formed by the gate electrode and the semiconductor film,
  discharging the capacitor for resetting the memory cell and,
  apply a higher potential to the P-doped electrode than to the N-doped electrode during the phase of reading the data stored in the memory cell so as to switch the transistor back into the on-state when the capacitor is charged.

BRIEF DESCRIPTION OF THE DRAWINGS

Other advantages and features will more clearly arise from the following description of particular embodiments of the invention given as nonrestrictive examples and represented in the annexed drawings, in which.

DESCRIPTION OF A PREFERENTIAL EMBODIMENT OF THE INVENTION

The memory cell comprises a transistor connected to a control circuit. The transistor is of the $Z^2$FET type, i.e. a field-effect transistor with zero impact ionization and with a vertical subthreshold slope (Zero swing and Zero ionization Field Effect Transistor).

Figure 1:
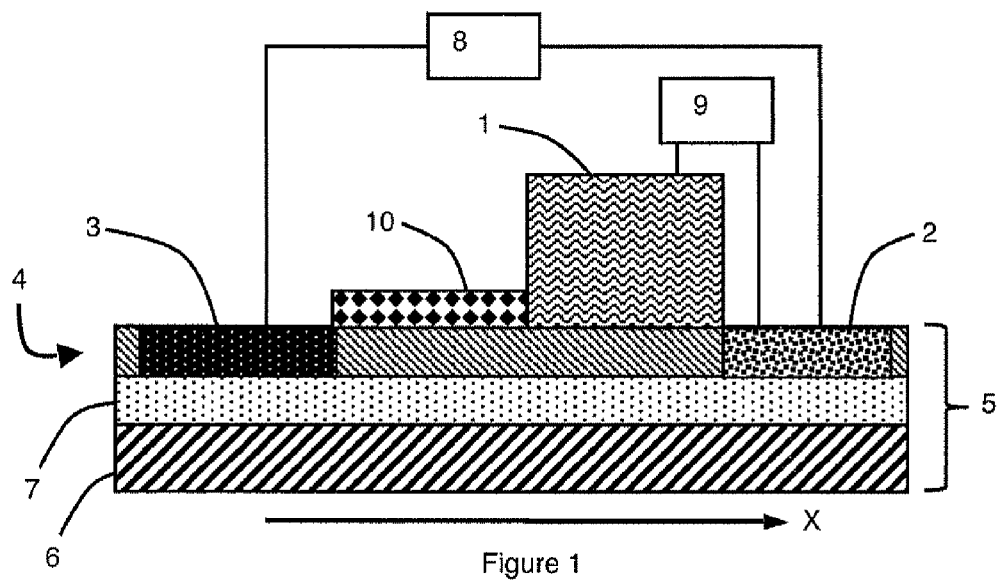
FIGS. 1 to 6 represent, in a schematic way, a cross-section of various embodiments of a transistor having a vertical sub-threshold slope.

As illustrated in FIG. 1, the transistor comprises a gate electrode 1, a first source/drain electrode 2 and a second source/drain electrode 3. The transistor is made on a semiconductor film 4, in a preferential way on a substrate 5 of the semiconductor on insulator type which comprises a support substrate 6, a electrically insulating layer 7 and the semiconductor film 4. The support substrate 6 is separated from the semiconductor film 4 by the electrically insulating layer 7.

The gate electrode 1 is separated from the semiconductor film 4 by a dielectric gate material (not represented) which is an electrically insulating material. The gate electrode 1 is formed by an electrically conducting material which allows to have an electrostatic effect on the semiconductor film 4. The first and second source/drain electrodes 2 and 3 are formed in the semiconductor film 4 and they are separated by an inter-electrode area in the semiconductor film 4.

The inter-electrode area is an area of the film 4 which advantageously presents at least one portion having a doping level lower than the doping levels of the source/drain electrodes 2 and 3. Preferably, the inter-electrode area is a non-intentionally doped (nid) area, for example a volume of the film 4 with a P- or N-doping level of about $10^{16}$ at/cm$^3$. Alternatively, it is also possible to have an more doped inter-electrode area, for example with doping levels of about $10^{16}$ or $10^{17}$ at/cm$^3$.

In a particular embodiment illustrated in FIG. 1, the inter-electrode area is a slightly doped area with a uniform doping level from the first electrode 2 to the second electrode 3. This embodiment allows to obtain a good mobility in the conduction channel connecting the two source/drain electrodes 2 and 3.

In the semiconductor film 4, the source and drain electrodes are separated by a conduction channel which is disposed directly under the gate electrode 1. The film 4 is advantageously a single-crystal film to increase electric performances of the transistor.

In some embodiments in which the transistor is realized with other active devices on the semiconductor film 4, the transistor is electrically insulated from the rest of the substrate by means of an insulation pattern (not represented). The insulation pattern is made out of an electrically insulating material surrounding the transistor. The insulation pattern is inserted in the semiconductor film 4. It can also be inserted in the electrically insulating layer 7 and in the support substrate 6.

The first source/drain electrode 2 is formed in the semiconductor film 4 by a first doped area of a first type of conductivity. The second source/drain electrode 3 is formed in the semiconductor film 4 by a second doped area of a second type of conductivity opposite the first type of conductivity. The two source/drain electrodes are formed in the semiconductor film 4 and they are shifted from one another in order to be separated by the inter-electrode area. For example, the first source/drain electrode 2 is N-doped and the second source/drain electrode is P-doped. The opposite configuration is also possible.

In a general way, there are thus a N-doped source/drain electrode and another P-doped source/drain electrode. As an example, in a semiconductor layer of the group IV, for example made of silicon, germanium or a silicon-germanium alloy, the N-doping is obtained by incorporating arsenic or phosphorus. The P-doping is obtained for example by incorporating boron or indium. Other semiconductor materials are possible such as so-called III-V or II-VI materials.

In the transistor, there is schematically a PN-type diode which is formed by the two source/drain electrodes which are two oppositely doped electrodes. As the first source/drain electrode 2 is not in direct contact with the second source/drain electrode 3, the structure is not exactly that of a PN diode. If the inter-electrode area is not doped or is not intentionally doped, the structure of the diode can be comparable with a diode of the PIN type disposed in the semiconductor film 4. The PIN diode is formed by the two source/drain electrodes 2 and 3 and by the inter-electrode area. If the inter-electrode area is doped, a little more complex structure is obtained. The inter-electrode area is partly covered by the gate electrode 1.

The field-effect transistor also comprises a biasing circuit 8 for biasing the first source/drain electrode 2 with respect to the second source/drain electrode 3 in order to apply a first potential difference between the two source/drain electrodes. The biasing circuit 8 is configured so as to forward bias the diode defined by the two source/drain electrodes, i.e. the device comprises means for applying a higher potential to the P-doped electrode than to the N-doped electrode.

In other words, the biasing circuit 8 is configured so that the potential applied to the P-doped electrode is higher than the potential applied to the N-type electrode.

The bias applied to the two source/drain electrodes results in reducing the amplitude of the potential barrier existing in the valence and conduction bands (in the absence of bias), which also results in the appearance of a current of charge carriers between the two source/drain electrodes.

The device can function by enrichment or depletion. For clarity reasons, only one operating mode is described but the man skilled in the art will understand that the device can be transformed to implement the other operating mode.

Figure 7:
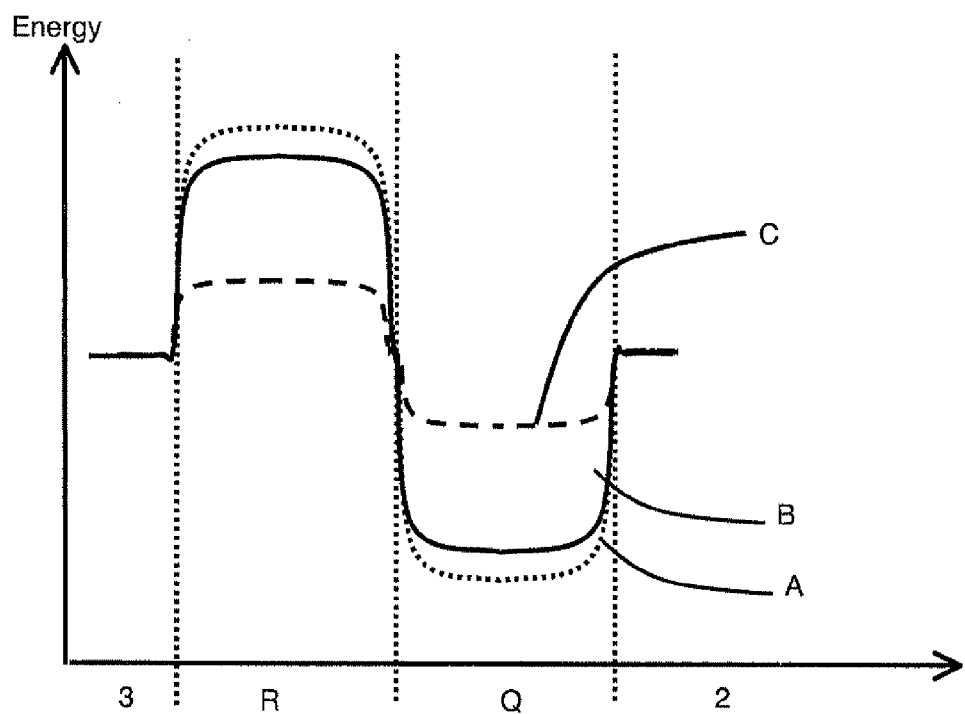
FIGS. 7 and 8 represent, in a schematic way, the band diagrams of a transistor submitted to various biasing voltages and the current circulating in the transistor according to the biasing voltage at the gate electrode.

The field-effect transistor comprises a first generator for generating a first potential barrier Q in the semiconductor film 4 and a second generator for generating a second potential barrier R in the semiconductor film 4 (FIG. 7). The first and second potential barriers are laterally shifted from one another, i.e. they are disposed in series in a direction X which connects the first source/drain electrode 2 to the second source/drain electrode 3. The first potential barrier Q is disposed adjacent to the first source/drain electrode 2 and the second potential barrier R is disposed adjacent to the second source/drain electrode 3. In this manner, the second potential barrier R is separated from the first electrode 2 by the first potential barrier Q and the first potential barrier Q is separated from the second electrode 3 by the second potential barrier R according to X axis.

The first potential barrier Q is configured to be opposed to the passage of the electric charges emitted by the first source/drain electrode 2 towards the second electrode 3. The second potential barrier R is configured to be opposed to the passage of the electric charges emitted by the second source/drain electrode 3 towards the first electrode 2. A potential barrier represents a local minimum or maximum of energy in the conduction band or the valence band.

In this manner, if the first electrode 2 is N-doped, the first potential barrier Q in the conduction band is opposed to the passage of the electrons emitted by the electrode 2 towards the second electrode 3 and the second potential barrier R in the valence band is opposed to the passage of the electron holes emitted by the second electrode 3 towards the first electrode 2.

If the first electrode 2 is P-doped, the first potential barrier Q in the valence band is opposed to the passage of the electron holes emitted by the electrode 2 towards the second electrode 3 and the second potential barrier R in the conduction band is opposed to the passage of the electrons emitted by the second electrode 3 towards the first electrode 2.

The first biasing circuit or the second biasing circuit is a variable-amplitude biasing circuit. In this manner, the amplitude of the first potential barrier Q and/or of the second potential barrier R can be modulated according to the instruction applied by the associated biasing circuit. This modulation of one of the potential barriers allows to define the quantity of current passing through the transistor and thus to define an on-state and an off-state.

The first and second potential barriers can be obtained by means of various techniques, for example by means of various electrostatic control devices which are disposed facing the inter-electrode area, i.e. in order to cover at least partially the inter-electrode area in the direction of the axis X connecting two the electrodes 2 and 3. It is also possible to form a potential barrier by using the electronic properties of the material forming a part of the inter-electrode area without using an electrostatic device.

Various embodiments of the transistor in the memory cell are illustrated below as an example. Other transistors can be used insofar as they comprise two generators for generating first and second potential barriers, a gate electrode 1 connected to a voltage source and a PN-type diode formed by the two source/drain electrodes.

In a preferential embodiment illustrated in FIG. 1, the variable-amplitude biasing circuit comprises a biasing circuit 9 for the gate electrode 1. The biasing circuit 9 for the gate electrode 1 is then configured so as to generate, facing the gate electrode 1, the first potential barrier Q. This potential barrier tends to be opposed to the passage of the charge carriers emitted by the nearest source/drain electrode. In this manner, the distribution of the potentials in the semiconductor film 4 tends to reduce the probability that an electric charge transits between the source and drain electrodes. It is also possible, in an opposite configuration, to consider that the biasing circuit 9 for the gate electrode 1 is configured so as to generate, facing the gate electrode, the second potential barrier R, which has been said for the first barrier can be applied to the second barrier and conversely.

Thus, when the gate electrode 1 is adjacent to the first source/drain electrode 2, i.e. when the gate electrode 1 is closer to the first electrode 2 than to the second electrode 3, two scenario are possible. The biasing circuit 9 for the gate electrode 1 is configured so that the potential of the gate electrode 1 is lower than the potential of the first electrode 2 when the first electrode is P-doped. The biasing circuit 9 for the gate electrode 1 is configured so that the potential of the gate electrode 1 is higher than the potential of the first electrode 2 when the first electrode 2 is N-doped.

In the rest of the description, the gate electrode 1 is considered adjacent to the first electrode 2 as it is represented in the various Figures, but it is also possible to have the gate electrode 1 adjacent to the second electrode 3, which involves a position switch of the various elements described.

In this embodiment, the other potential barrier (here, the second potential barrier) can preferentially be defined with controlling means applying a bias, for example a constant bias. The other potential barrier can also be defined by modulating the properties of the energy bands by means of fixed electric charges disposed near the semiconductor film or by modulating the properties of the energy bands in the inter-electrode area.

In a particular embodiment illustrated in FIG. 1, the other potential barrier comes from electric charges present at the interface between the semiconductor film 4 and a covering insulating film 10 or present in the electrically insulating film 10. The covering insulating film 10 covers at least partially the area located between the gate electrode 1 and the second electrode 3. This electrically insulating material comprises trapped electric charges while being still electrically insulating. It is still possible to place pending chemical bonds at the interface with the film 4 so as to generate electric charges. The selected production method allows to modulate the quantity of electric charges present at the interface. For example, it is possible to deposit a silicon oxide comprising positive electric charges by means of chemical vapor deposition. In this case, there are two generators for modulating the level of the energy bands in the semiconductor film 4 by electrostatic effect. These two electrostatic controls are facing the inter-electrode area and they are shifted, in the direction of the axis X, from one another in order to generate two distinct potential barriers. One of the electrostatic controls is variable in amplitude, the gate electrode 1. The other electrostatic control is constant as it can be the case with the electric charges associated with the covering film 10.

Figure 2:
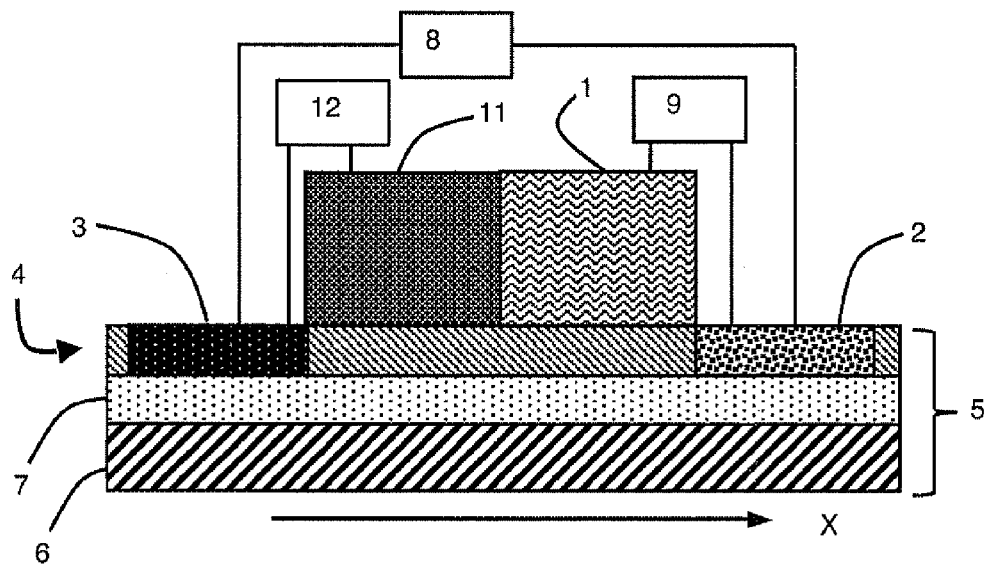

In another embodiment illustrated in FIG. 2 which can be combined with the preceding embodiment, the other potential barrier is introduced by means of an additional gate electrode 11 which is disposed adjacent to the gate electrode 1. The two gate electrodes cover the inter-electrode area and generate two distinct potential barriers. The additional gate electrode 11 is connected to a biasing circuit 12 for the additional electrode which is configured to generate the second potential barrier. The additional gate electrode is electrically separated from the semiconductor film 4 by an electrically insulating material. The gate electrode 1 and the additional gate electrode 11 are disposed on the same side of the semiconductor film 4. The two gate electrodes are electrically dissociated from one another.

Figure 3:
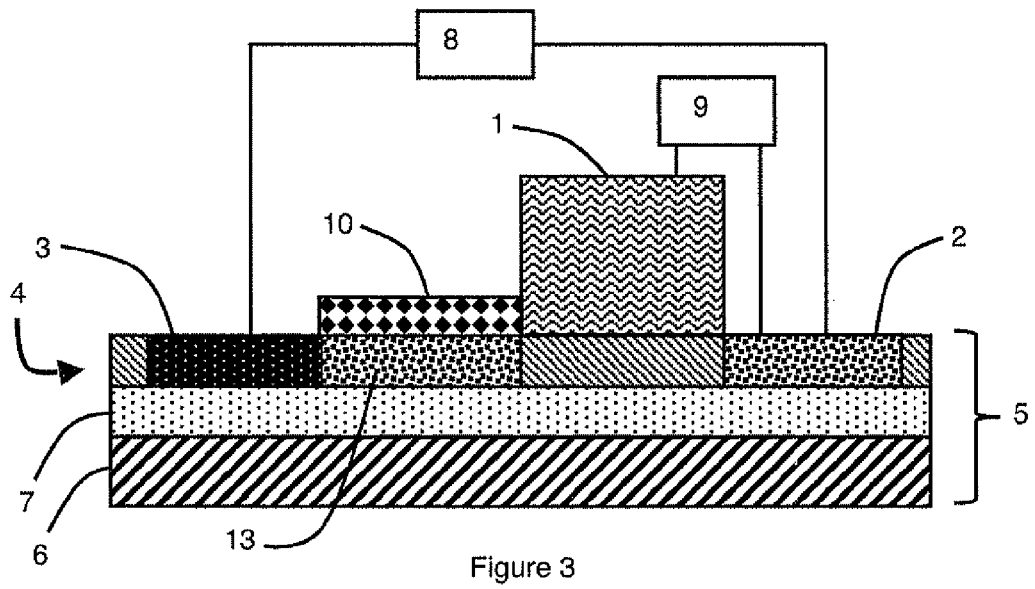

Into another embodiment illustrated in FIG. 3 which can be combined with the preceding embodiments, the second potential barrier is introduced into the semiconductor film 4 by means of an additional doped area 13 located between the two source/drain electrodes 2 and 3. The additional doped area 13 is disposed near the source electrode or the drain electrode and its doping type is selected so as to form a PN junction with the nearest electrode. Thus, the additional area 13 is of N-type if it is placed near the P-doped source/drain electrode. On the contrary, the additional area 13 is of P-type if it is placed near the N-doped source/drain electrode. The use of the doped area 13 makes it possible to reduce the variability of the value of the barrier by using a material for which the position of the conduction and valence bands is known. Using the area 13 also makes it possible to form the second potential barrier using without a biasing source.

In the embodiment illustrated in FIG. 3, the gate electrode 1 is placed beside the first electrode 2 and the additional doped area 13 is placed beside the second electrode 3. The additional doped area 13 is doped in the same manner as the first electrode 2. In a general way, the doped area 13 has a doping type opposite that of the nearest electrode so as to form a PN junction in the same direction as the PN junction formed by the first electrode 2 and the second electrode 3. The structure of the semiconductor film can be, from the electrode 2 to the electrode 3, of the type PIPN, NINP, PNPN or NPNP. The electrodes 2 and 3 are of opposite types and between these two electrodes various arrangements are possible which can lead to the use of two PN or NP diodes in series or to the use of a PIN diode with a doped area placed between the intrinsic area and the electrode 2 or 3 to form an additional diode.

Figure 4:
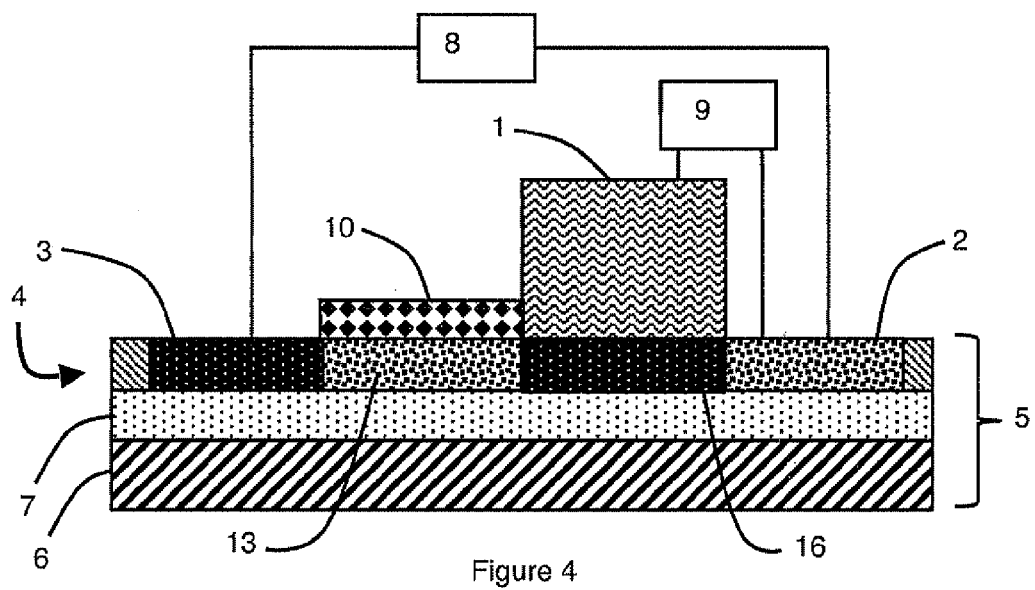

In the particular example illustrated in FIG. 4, the additional doped area 13 is associated to a complementary doped area 16. In this particular scenario, the semiconductor film 4 comprises two diodes of the PN or NP type mounted in series between the two electrodes 2 and 3. The two diodes are oriented in the same direction so as to have the PNPN or NPNP structure. The extreme terminals of this stacking are formed by the first or second electrodes 2, 3.

Moreover, these various particular embodiments illustrate the fact that the device can function by enrichment or depletion.

The additional doped area 13 is advantageously formed on a substrate of the semiconductor on insulator type. In a preferential way, the additional doped area 13 extends on all the thickness of the semiconductor film 4, i.e. from the surface in contact with the electrically insulating layer to the opposite surface which is covered by the gate dielectric.

As it is indicated above, the additional area 13 can be associated with the covering layer 10 and/or an additional gate electrode 11 in order to cumulate the effects.

The amplitude modulation of one of the two potential barriers makes it possible to control the quantity of current passing through the transistor. The amplitude modulation in the two barriers also makes it possible to obtain this effect and to define the switching between the off- and on-states. The device takes advantage of the positive feedback which exists between the two potential barriers. Thus, when the amplitude of one of the potential barriers decreases (in absolute value), the amplitude of the other potential barrier also decreases.

Figure 5:
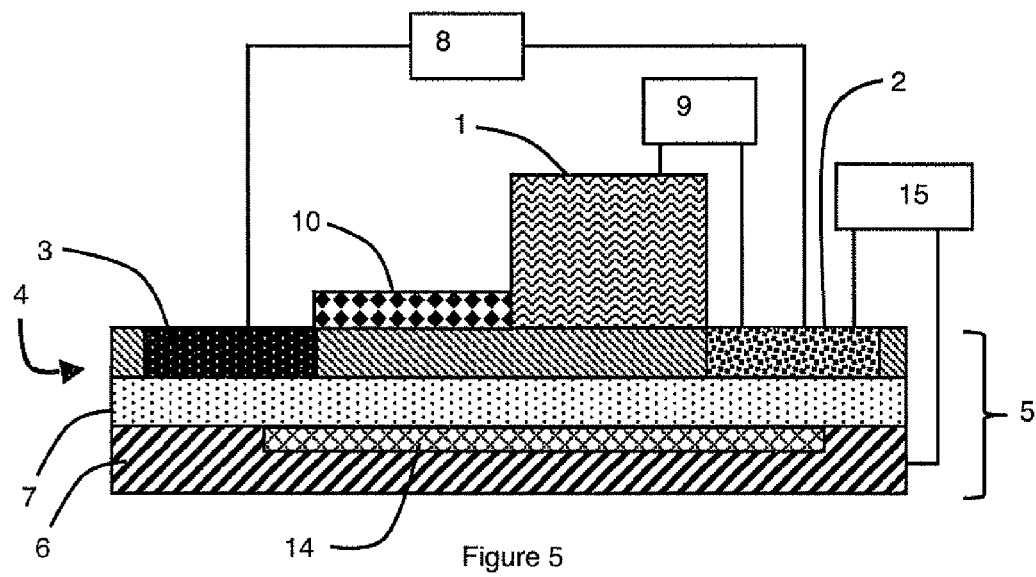

In another embodiment illustrated in FIG. 5 which can be combined with the preceding embodiments, the substrate comprising the field-effect device is a substrate 5 of the semiconductor on insulator type with a counter-electrode 14. The counter-electrode 14 is separated from the semiconductor film 4 by the electrically insulating layer 7. The counter-electrode 14 faces at least a part of the inter-electrode area. The counter-electrode 14 can also face at least a part of the gate electrode 1. The device then comprises a biasing circuit 15 for biasing the counter-electrode 14 which is configured so as to generate a potential difference between the first electrode 2 and the counter-electrode 14 which has the same sign as the existing potential difference between the first electrode 2 and the gate electrode 1, whether the first electrode 2 is P-doped or N-doped.

In other words, the biasing circuit 15 of the counter-electrode 14 is configured to present a potential difference between the N-doped electrode and the counter-electrode 14 which has the same sign as the potential difference between the N-doped electrode and the gate electrode 1 when the gate electrode 1 is located on the N side. The biasing circuit 15 of the counter-electrode 14 is configured to present a potential difference between the P-doped electrode and the counter-electrode 14 which has the same sign as the potential difference between the P-doped electrode and the gate electrode 1 when the gate electrode 1 is located on the P side.

The counter-electrode 14 can be facing the gate electrode 1. There is a difference in dimension between the two electrodes 1 and 14 in the direction of the axis X so as to be able to generate two potential barriers which are shifted with respect to the axis X and which are oriented in opposite directions of potential.

The counter-electrode 14 can still be shifted with respect to the first gate electrode 1 in order to reduce, even to avoid, a covering of the electrostatic forces applied.

In a general way, the first and second potential barriers generated in the semiconductor film prevent the charge carriers from passing between the first and second electrodes 2 and 3. In this configuration, a very low current (current at the OFF state) flows between the first and second electrodes, i.e. a parasitic current.

The amplitude modulation of the first barrier can be obtained by means of the potential applied to the gate electrode 1 or by means of the potential applied to the counter-electrode 14 or by a combination of these two parameters.

It is also possible to have a fixed potential difference between the gate electrode 1 and the counter-electrode 14, the amplitude modulation of the barrier being only carried out by means of the counter-electrode 14 in the area not covered by the gate electrode 1. The counter-electrode works as a gate electrode which generates a first potential barrier. There is moreover a generator for generating a second potential barrier which is opposed to the electrostatic effect induced by the counter-electrode 14.

In still another alternative embodiment, not represented, the counter-electrode 14 is disposed between the two source/drain electrodes, which makes it possible to generate a first potential barrier Q in the film 4 between the two electrodes 2 and 3. The gate electrode 1 is disposed near one of the two electrodes in order to generate the second potential barrier R.

Figure 6:
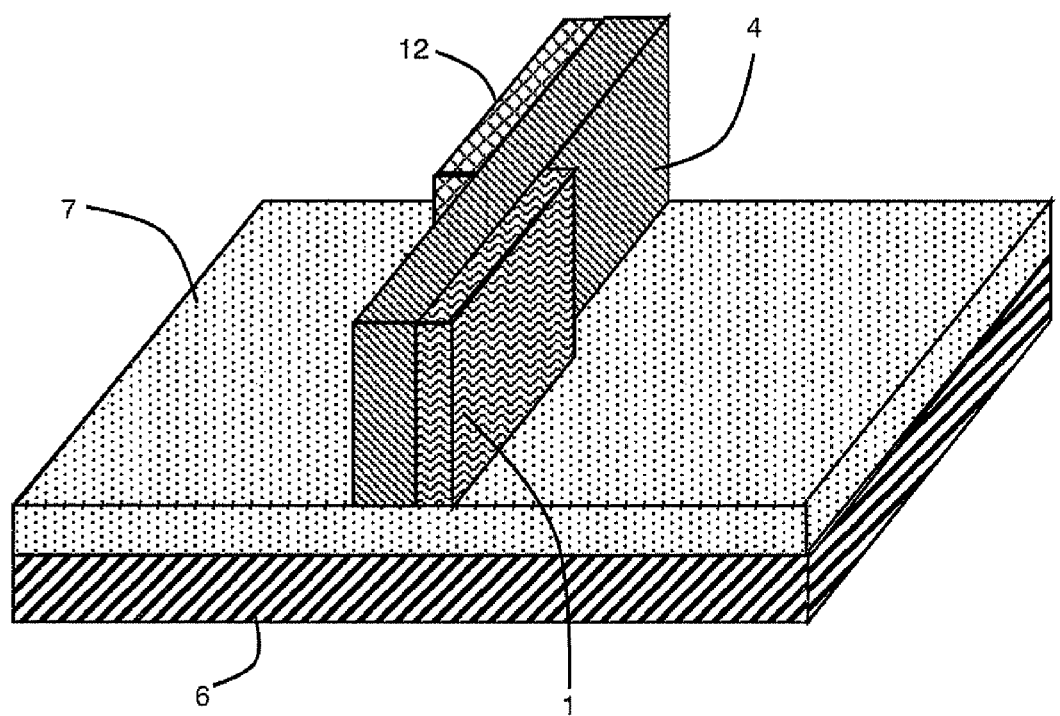

In another embodiment, illustrated in FIG. 6, the first generator for generating the first potential barrier Q in the semiconductor film 4 and the second generator for generating the second potential barrier R in the semiconductor film 4 are disposed on both sides of the semiconductor film 4.

The semiconductor film 4 is a pattern which protrudes from an electrically insulating film. The electrically conducting film comprises two opposite main faces and at least one side face which connects the two main faces. The side face has an interface with the electrically insulating layer 7. The device can thus be formed on a substrate of the semiconductor on insulator type but in a configuration different from that represented in FIG. 3. Whereas the preceding embodiments allowed a co-integration with transistors according to a so-called planar architecture, this last embodiment allows the co-integration with transistors according to a so-called "Fin-Fet" architecture. The difference between this type of device and a conventional transistor comes from the doping of the source and drain electrodes and the covering area of the gate electrode.

It is also possible to make the field-effect transistor in a so-called "double gate" architecture, for example by means of a semiconductor canal which is suspended or disposed above the semiconductor substrate. The two gates are separated by the semiconductor film 4. In this case, the substrate of the semiconductor on insulator type is not compulsory. Like for the preceding embodiment, the difference between this type of device and a conventional transistor comes from the doping of the electrodes from source and drain and in the surface of covering of the gate electrode.

The gate electrode 1 is formed on one of the main faces and the second generator for generating the second potential barrier R is formed on the other main face. The second device can be formed by a covering film 10 or, advantageously, by a second gate electrode which works as a counter-electrode 12. In this embodiment, there is a great freedom in the choice of the material forming the gate dielectric as well in the formed thickness.

The embodiments indicated above and illustrated for example in FIGS. 1 and 2 can be combined with this embodiment. The two generators for generating the potential barriers can be on the same side of the film 4, i.e. on the same main face or opposite main faces.

In the particular embodiments illustrated in FIGS. 1 to 6, the surface which separates the first source/drain electrode 2 from the second source/drain electrode 3 is not completely covered by the gate electrode 1. Thus, in an axis X which connects the two source/drain electrodes, a part of the distance travelled by the charge carriers is covered by the gate electrode 1 and another part has not this cover so that this other part is not submitted to the electrostatic influence of the gate electrode 1. In this manner, there exists above the area defined by the source and drain electrodes, a portion covered by the gate electrode 1 and a portion which is covered by a dielectric material with no gate electrode 1 or a part which is not covered by a material in a solid or fluid state. The structure is called asymmetrical because the gate electrode 1 is not disposed at the same distance from the two source/drain electrodes 2 and 3 in a top view or a sectional view. It is the same when the counter-electrode 14 does not cover all the inter-electrode distance or when it is not disposed at the same distance between the two electrodes 2 and 3.

In a preferential way, the gate electrode 1 is located above the inter-electrode area so that one of its side walls is immediately adjacent to one of the two source/drain electrodes or so as to slightly cover the first electrode 2. In this configuration, one of the side walls of the gate electrode is aligned with the interface between the first electrode 2 and the inter-electrode area. This particular configuration makes it possible to obtain a good compactness of the transistor.

The gate electrode 1 is thus located on the N side of the device (i.e. in the immediate vicinity of the N-doped electrode) or on the P side of the device (i.e. in the immediate vicinity of the P-doped electrode).

Figure 8:
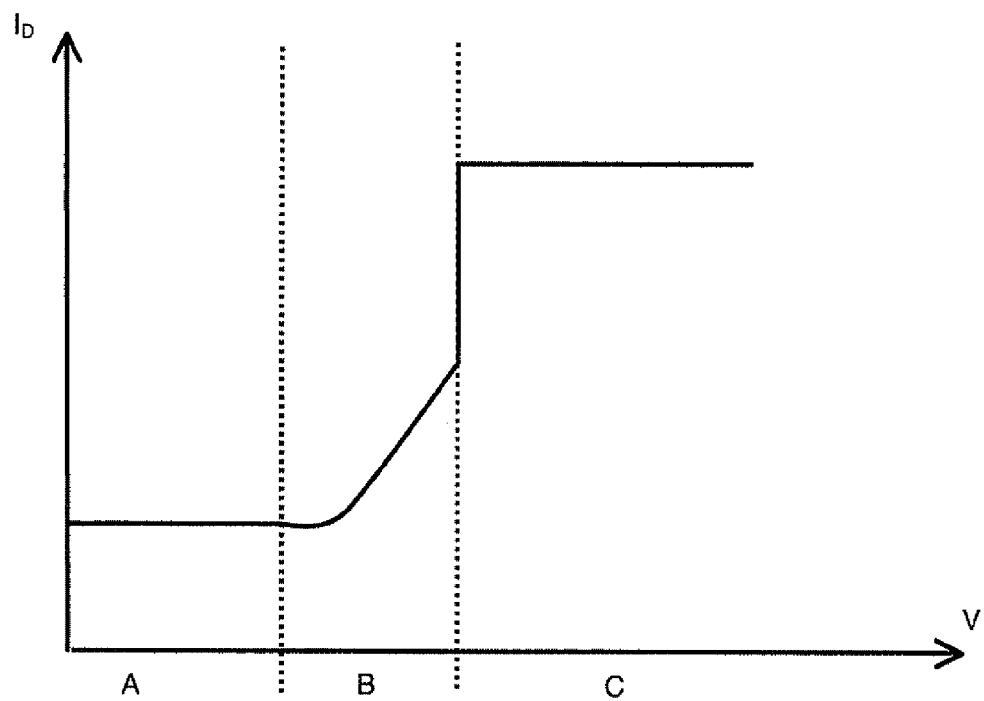

FIG. 7 represents the evolution of the potential of the valence band or the conduction band inside the transistor for several biasing conditions. FIG. 8 represents the current ID which circulates between the first electrode 2 and the second electrode 3 according to the potential difference applied, for example, between the first electrode 2 and the gate electrode 1.

FIG. 7 represents the valence band or the conduction band in the first source/drain electrode 2, in the first potential barrier Q, in the second potential barrier R and in the second source/drain electrode 3. FIG. 7 will be described by considering that the expression "energy band" refers to the valence band or the conduction band according to the type of carrier considered. The illustrated example corresponds to a gate electrode 1 placed near a first N-doped electrode 2. The values of the potentials are reversed if the first electrode 2 is P-doped.

The potential difference applied between the first source/drain electrode 2 and the second source/drain electrode 3 is configured so as to pass in a forward state the diode which exists between the two electrodes 2 and 3, which results in bringing together the levels of potential of the energy band between the first and the second electrodes. In this case, the potential applied to the second electrode 3 is higher than the potential applied to the first electrode 2. In the example in FIG. 7, the levels of the energy band are identical for the two source/drain electrodes, but different barriers can be possible.

The potential applied to the gate electrode 1 generates the first potential barrier Q which is opposed to the migration of the electrons towards the P-doped electrode 3. The second potential barrier is in the opposite direction and it is opposed to the migration of electron holes from the P-doped electrode 3 to the N-doped electrode 2. This situation is represented schematically by curve A.

In this configuration, a very low current circulates between the two source/drain electrodes as it is represented in part A in FIG. 8.

The potential applied to the gate electrode 1 varies so as to reduce the amplitude of the first potential barrier Q what involves an increase in the passage probability of the charges emitted by the first electrode 2 and thus a slight increase in the current value. The charges emitted by the first electrode 2 reach the second electrode 3, which modifies the value of the amplitude of the potential barrier R, it allows the emission of electric charges in the other direction. This reduction in the amplitude of the two potential barriers is represented by curve B.

As it is illustrated in part B in FIG. 8, as the value of the amplitude of the first potential barrier diminishes, the value of the current ID circulating inside the transistor increases. From a moment when the gate potential 1 reaches a threshold value, the electric charges emitted by the first electrode and passing the first potential barrier Q are able to create a reduction in the amplitude of the second potential barrier R and create an important current from the second electrode 3 to the first electrode 2. Each of the two currents of electric charges leads to a reduction of the two potential barriers so that an important current suddenly starts to circulate inside the transistor as it is represented in area C in FIG. 8.

As it can be seen in FIG. 7, when the current passes through the transistor in the on-state, the potential barriers Q and R are reduced in amplitude.

Electrical measurements were carried out on a device and the parasitic current measured in the off-state is inferior or equal to $10^{-13}$ A/µm (mode A). The current circulating in the on-state (mode C) varies between $10^{-8}$ and $10^{-3}$ A/µm according to bias conditions for the diode. The reverse of the subthreshold slope of this particular architecture is better than what is classically measured for the conventional transistors (approximately 1 mV/decade against 60 mv/decade for the prior art).

In addition, the transistor works when the diode is directly biased and when the flow of charge carriers is controlled by means of two potential barriers of opposite directions. When it is used, the transistor does works by impact ionization or by tunnel effect, two phenomena which are harmful for a good performance of the device over time.

A control circuit is associated with the transistor in order to form the dynamic memory cell.

The control circuit associated with the transistor is configured to bias the transistor so as to write a first state, to write a second state, to read the state stored in the memory cell, i.e. the data stored in the transistor and to reset the memory cell. In an arbitrary way, in the following examples, the source electrode is considered as being at a fixed potential in order to simply describe the potential differences which exists between the electrodes of the transistor during the multiple operations of writing, reading and resetting. The person skilled in the art will understand that the position of the potentials applied to the various electrodes makes it possible to obtain the required operation. The gate electrode control the first potential barrier and is placed, here, adjacent to the drain electrode.

As an example, the source electrode is considered as being connected to the ground. Digital data given below correspond to the values measured in experiments on a transistor formed on a substrate of the silicon on insulator type with an electrically insulating layer 7 made of silicon oxide having a thickness of 140 nm. The gate dielectric is a silicon oxide having a thickness of 6 nm formed on a silicon layer 4 whose thickness is equal to 20 nm. The length of the gate electrode is equal to 400 nm, the width of the gate electrode is equal to 10 µm. The source and drain electrodes are at a distance 600 nm from one another and there is no covering between the two generators for generating the potential barriers.

The dimensions of such a device are that of a test device and the person skilled in the art will keep in mind that such a device can have more reduced dimensions in order to follow the current trend in miniaturization. A device with dimensions of about 70 nm can be easily obtained in an industrial way. Progressively with the miniaturization thereof, the voltages applied for the phases of writing, reading and holding the stored data can also be reduced down to about 1 Volt.

The first potential barrier is controlled by the gate electrode and the second potential barrier is not modulated from the outside in the following examples. Writing the first state, for example the low state of the cell, corresponds to resetting of the memory cell. Writing this first state is carried out by leaving the diode between the source and drain electrodes in the off-state, i.e. the diode does not or hardly let the current passing through. The bias applied between the source and drain electrode is lower than 0.5V in direct bias, i.e. the diode cannot be biased (a null bias at its terminals) or a reverse bias is applied between the two source/drain electrodes. In a preferential way, the potential difference applied between the source and drain electrodes is configured so that no current circulates between the two electrodes, the diode is then in an off-state.

The control circuit is also configured so as to reset the capacitor which is defined by the gate dielectric. One of the capacitor electrodes is formed by the gate electrode and the other electrode is formed by the part of the semiconductor film 4 which faces the gate electrode. More particularly, the part of the film 4 adjacent to the drain electrode here forms an electrode of the capacitor. The potential applied to the gate electrode 1 is configured so as to discharge the capacitor. The potential is configured so that there is a zero or substantially zero potential difference between the two electrodes of the capacitor, i.e. between the gate electrode 1 and the film 4 directly under the gate electrode 1.

In a particular embodiment, the memory cell is configured so that there is a zero potential difference between the gate electrode and the adjacent source/drain electrode, here the drain electrode, which makes it possible to strongly decrease the quantity of electric charges in the capacitor.

Figure 9A:
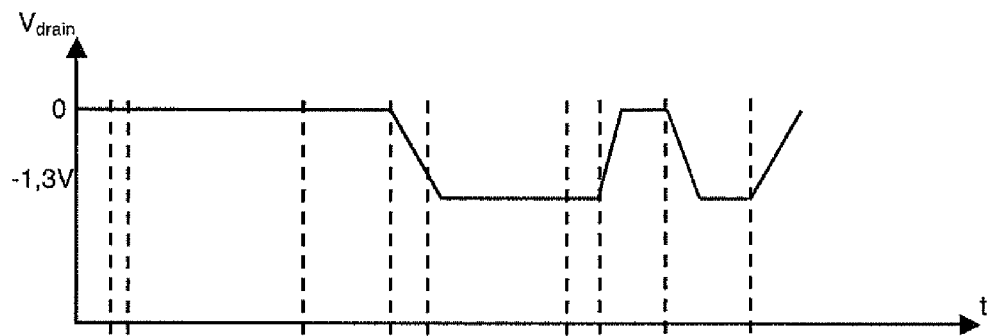
FIGS. 9a and 9b represent, in a schematic way, the chronograms of the potential applied to the drain electrode of the transistor and to the gate electrode of the transistor.
Figure 9B:
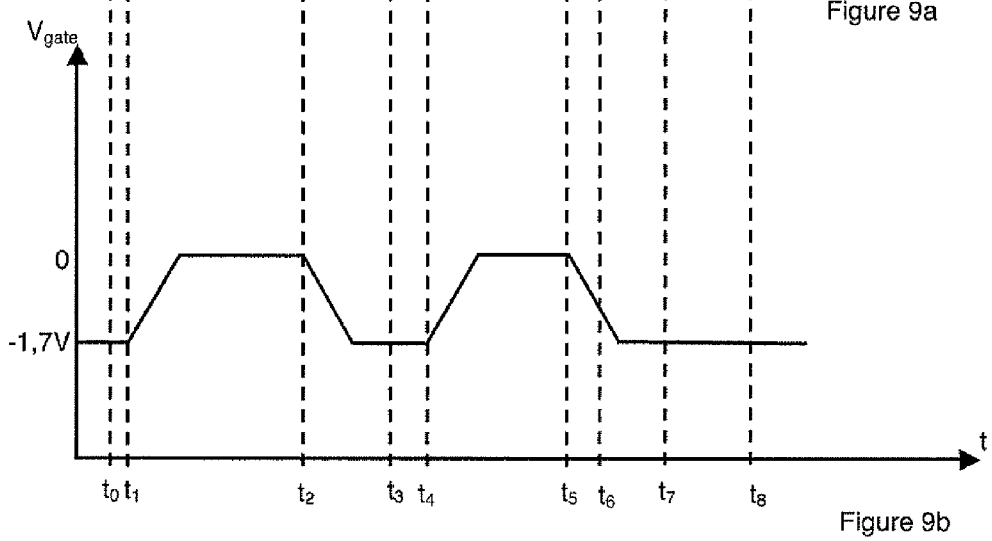

FIG. 9*a* represents a chronogram of the drain voltage. FIG. 9*b* represents a chronogram of the gate voltage. The phase of resetting the memory cell is represented between time $t_0$ and $t_2$. At time $t_0$, the drain voltage is selected so as to switch the diode into an off-state. Then, at a point in time $t_1$, the gate voltage is modified so as to reset the capacitor formed by the gate electrode and the film 4, for example so as to have a zero potential difference between the two electrodes of the capacitor. From time $t_1$, the charges possibly present in the memory cell are removed.

At time $t_2$, the capacitor is discharged and the gate voltage can be modified, for example in order to find the same value as before time $t_1$. The gate voltage is advantageously modified to place the memory cell in a phase of holding the imposed state, here to store an absence of charge into the capacitor. However, in certain operating modes, the gate voltage can be equal to the value present for example at time $t_0$ or it can be kept according to the next action planned for the memory cell.

Figures 10A, 10B:
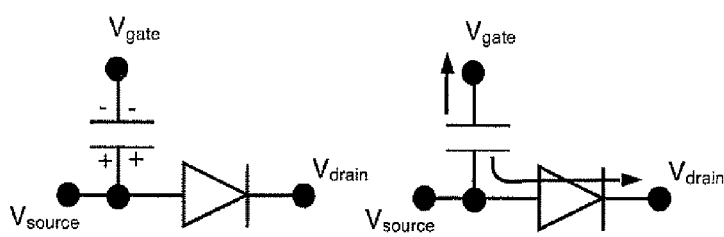
FIGS. 10a and 10b represent, in a schematic way, a transistor according to FIGS. 1 to 6 during the phase of setting the memory cell and/or of writing a first state.

FIGS. 10*a* and 10*b* represent, schematically, the transistor illustrated in FIGS. 1 to 6 with the diode formed between the source and drain electrodes and the capacitor formed by the gate electrode and the film 4. The second gate or the generator for generating the second potential barrier is not represented. The phase of resetting the memory cell makes it possible to switch from a transistor according to FIG. 10*a* to a transistor according to FIG. 10*b*. FIG. 10*a* represents a memory cell in the second state, i.e. with electric charges stored in the capacitor. The bias applied between the source and drain electrodes is selected so that the diode is in an off-state. When the potential difference at the terminals of the capacitor becomes nil, the charges in each electrode are evacuated as it is represented schematically by the arrows in FIG. 10*b*. The evacuation of the charges is carried out for example by applying a zero potential to the gate electrode and the drain electrode (the source electrode being also at the zero potential by convention).

As a particularly advantageous example to be implemented, if a zero potential difference is applied between the source and drain electrodes, it is enough to apply a zero potential difference between the source and gate electrodes. All the source, drain and gate electrodes are at the same potential.

Writing the second state of the memory cell is carried out by biasing the transistor so as to switch it into the on-state. The control circuit is configured so as to forward bias the diode defined by the two source/drain electrodes, i.e. the control circuit is configured so as to apply a first potential difference between the source and drain electrodes configured so that the potential applied to the P-doped electrode is higher than the potential applied to the N-doped electrode. The potential difference applied between the source and drain electrodes is configured to allow the passage of a current which higher than a threshold, this threshold is reached for example with a potential difference higher than 0.5V.

The control circuit is also configured so as to apply a potential to the gate electrode 1 or potentials to the gate electrode 1 and the counter-electrode 11, 12 or 14 which allow the passage of a current of charge carriers between the source and drain electrodes. During writing the second state, there is passage of a current between the source and drain electrodes. There are then electron holes and electrons in excess in the canal.

In FIG. 9*a*, time $t_3$, the drain potential is modified so as to switch the diode into an on-state. In FIG. 9*b*, at time $t_4$, the gate potential is modified so as to reduce the potential barriers, which allows the passage of a current between the source and drain electrodes when the diode is in an on-state.

According to the embodiments, times $t_3$ and $t_4$ can be shifted from one another in one direction or the other or can be simultaneous.

Figures 11A, 11B:
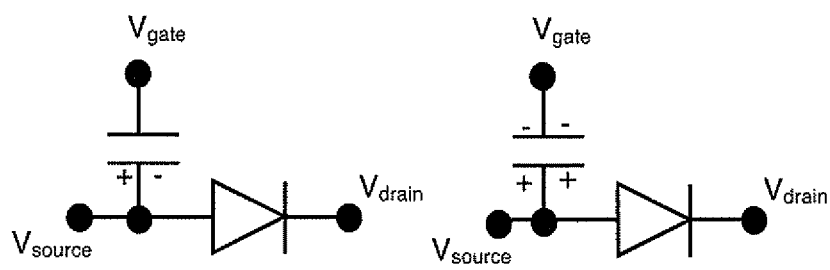
FIGS. 11a and 11b represent, in a schematic way, a transistor according to FIGS. 1 to 6 during the phase of writing a second state into the memory cell.

Once the transistor is in an on-state, the charge carriers in excess are present in the canal as it is represented in FIG. 11*a* whose diagrams are the same as in FIGS. 10*a* and 10*b*. The phase of writing a second state is carried out schematically by switching from the transistor in FIG. 11*a* to that in FIG. 11*b*.

In FIG. 9*b*, at time $t_5$, the gate potential is modified in order to switch the transistor in an off-state. The charges in excess in the canal are stored in the capacitor as it is represented in FIG. 11*b*. At the same time or after time $t_5$, for example at time $t_6$, the drain potential is modified in order to switch the diode into an off-state.

The drain potential is modified before or simultaneously with the gate potential in order to prevent the phase of writing the second state from being immediately followed by the phase of writing a first state, which corresponds to resetting the memory cell. In other words, during the phase of writing the second state, once the transistor is in the on-state, it is necessary to switch the transistor again into the off-state by means of the potential barriers. Then, in an advantageous way, the hold of the data in the memory cell is obtained by switching the diode into an off-state.

As example, when the drain electrode is doped of N-type, i.e. the gate electrode is immediately adjacent with the N-doped electrode, the on-state is obtained by applying a potential equal to −1.3V on the drain electrode and a potential equal to −1.7V to the gate electrode as that is represented on the FIGS. 9*a* and 9*b*. The source electrode is connected to the ground.

With such a device, the duration of programming a first state or a second state can be reduced to 1 ns.

The holding or storing operation for the first and second states of the memory cell is carried out by switching the transistor again into an off-state by means of the diode and the potential barriers. So, the potential difference between the source and drain electrodes can be zero or representative of a reverse bias of the diode or of a direct bias of the diode with a potential difference lower than 0.5V. The control circuit is thus configured to that end. The control circuit is also configured so that the potential barrier controlled by the gate electrode 1 is present so as to fix the canal state after the step of writing the first or the second state. Moreover, there is a potential difference between the capacitor terminals so as to keep the stored charges. The control circuit is configured so that, during the phase of holding the data, the potential difference between the gate electrode and the source electrode has the same sign as the potential difference imposed between the drain electrode and the source electrode so as to have a diode in the on-state (here $V_{DS}$ and $V_{GS}$ are negative). During the phase of holding, there is no current through the transistor.

When writing the second state, the charge carriers are injected into the canal and the passage to the step of holding the data makes it possible to store charge carriers in the potential barrier controlled by the gate electrode 1. As the charge carriers accumulated in the canal are in a equilibrium state, these charges are not lost with the result that this second state does not require any refresh.

When writing the first state, the electric charges present at the terminals of the capacitor defined by the gate dielectric have been eliminated, there are no charge carriers to be stored into the potential barrier. The voltage applied to the gate electrode tries to charge the capacitor. As the leakage current of the reverse-biased junction between the drain and the canal is very low, the capacitor cannot be charged. The holding time for this data is important, but it still depends on the technological imperfections of production, in particular on the quality of the reverse-biased drain/canal junction.

In the above-illustrated example, electron holes are stored in the canal opposite the gate electrode 1 for the second state. The data storage can be represented by a zero potential difference between the source/drain electrodes and by the presence of a gate potential equal to −1.7V.

The phase of reading is carried out by switching the diode into the on-state, at time $t_7$, preferably for a short period in order to have a high reading rate. During the reading phase, the control circuit is configured so as to apply a more important potential to the P-doped electrode than to the N-doped electrode, the diode is in an on-state. The control circuit is also configured so as to lower the potential barrier facing the gate electrode 1.

If the memory cell is in the first state, the diode in the on-state is not able to make the transistor switch into an on-state because the potential barrier under the gate is hold, there is thus no passage of a current between the source and drain electrodes.

If the memory cell is in the second state, charges are stored in the capacitor of the gate dielectric, in the potential barrier facing the gate electrode. The potential barrier is lowered because of the stored charges. The switching of the diode into the on-state will discharge, in a transitory way, the capacitor of the gate dielectric and will generate the switching of the transistor into an on-state. There is a passage of a current between the source and drain electrodes indicating that the memory cell is in the second state.

It was observed that too slow a switching of the diode from the off-state into the on-state leads to a loss of the charges present in the capacitor without the transistor switching into the on-state. This switching speed depends mainly on the dimensions of the transistor and on the quantity of charges stored in the capacitor.

As the charges will flow through the diode because of the reduction in the potential barrier, the switching of the diode from its off-state into its on-state is configured so as to make the transistor switch into the on-state when charges are stored in the capacitor. In a practical way, it is enough to have a fast switching of the potential difference applied to the diode terminals.

In an advantageous way, the minimal switching speed of the diode from the off-state into the on-state is equal to $10^3$V/s, preferably to 107V/s.

Such a device makes it possible to obtain a duration of reading of about 1 ns.

In a preferential way, the potential difference applied to the diode for it to be switched into the on-state has the form of an impulse. This impulse is configured so that the diode switches into an on-state while preventing the capacitor of the gate dielectric from being discharged when the memory cell is in the second state. This precaution makes it possible to obtain a nondestructive reading of the stored data. The impulse discharges the capacitor so that the transistor switches into an on-state, which results in reloading the capacitor for a possible new step of reading. In addition, using an impulse allows to quickly read the memory cell. At time $t_8$, the drain potential is modified so that the diode switches again into an off-state. From this time, the transistor is in the phase of holding the data.

In addition, using a reading phase by means of pulses makes it possible to improve the conditions of holding the first state by discharging the capacitor. The leakages in the transistor could have charged the capacitor.

In the devices obtained, a pulse of 15 nanoseconds applied to the drain electrode every five milliseconds makes it possible to store the data recorded during more than 1000 reading phases and it does not generate the passage from the first state into a second state.

Such a device makes it possible to have a holding duration for the data of about 1 second.

In a particular embodiment, a matrix of memory cells is formed. The matrix comprises a plurality of memory cells which are coupled to one another by means of one or more control lines.

A control line is a line which makes it possible to impose the gate, drain or source potential. In order to form a compact and easily exploitable matrix, it is advantageous to have an organization in rows and columns. A first control line connects together for example all the memory cells of the same row and a second control line connects together all the memory cells of the same column. An opposite organization is also possible. In this manner, the selection of a memory cell is carried out by biasing the two control lines for the required memory cell. The two control lines are biased so that the diode of the transistor and the first potential barrier Q are in the required state in order to carry out the writing of a high or low state, the reading or the holding of the stored data.

The gate electrodes are coupled with first control lines. The source or drain electrodes are coupled with second control lines. The drain or source electrodes can be coupled with a third control line organized in row or column, but it is advantageous to fix a common potential for all the source electrodes of the matrix, for example the ground. The use of a common potential makes it possible to reduce the number of lines to be managed in the matrix, which facilitates compactness.

As the phases of writing, reading and holding the data require to apply two sets of specific potentials for controlling the diode and of the first potential barrier, one must be sure that the writing of a state in a cell does not result in resetting or writing this state for all the cells of the same row or the same column, for example, the phase of writing a low state or resetting as indicated above.

For example, the reset of a memory cell is carried out by biasing the gate electrode 1 at the same potential as the channel and/or the same potential as the nearest source/drain electrode, here the drain electrode. During the resetting, the diode is in an off-state.

If two cells share for example the same control lines for modulating the potential of the drain electrode and the gate electrode, the resetting of a cell leads to the resetting of the cells sharing the same control lines.

In order to limit, even to prevent this scenario, various sets of potentials are applied according to whether the information of the cell must be modified or kept and according to whether the cell shares a control line with an cell to be modified.

The reset of the cell is carried out by modifying the biases applied to the terminals of the capacitor so as to have a zero or quasi-zero potential difference on the terminal thereof. In a preferential way, the reset of the cell is carried out by a zero potential difference between the gate electrode and the nearest source/drain electrode to the gate electrode ($V_{gate}=V_{drain}$).

A first embodiment is obtained by shifting the source voltage and the drain voltage of the cell to be modified with respect to the other cells. The shift of the source and drain voltages is carried out so as to have a source and drain voltage on the cell to be modified higher than the drain voltages of the other cells (except for the cells sharing the same drain control line). Thus, the shift carried out on the gate electrode to reset the capacitor makes it possible to keep the potential barrier for all the other cells sharing the same gate control line. This embodiment is particularly effective when the same row of cell does not divide the same lines of ordering of drain and grid.

In a second more general embodiment, particularly interesting if the source potential is common to all the memory cells of the matrix, the potential applied to the drain electrode is modified in order to be closer to the potential allowing to switch the diode into the on-state. The diode is in an off-state, which can result in the following relation $|V_{drain}-V_{source}|=0.7V$, where 0.7V represents the voltage from which an important current flows through a silicon diode if the transistor is formed in a silicon substrate. Another threshold value can be applied if the semiconductor material is different from silicon.

In other words, the deviation from the potential difference between the source and drain electrodes necessary to obtain the on-state of the diode is lower for the memory cells belonging to the same row or the same column than for the cell to be modified.

The potential applied to the gate electrode is also modified in order to be equal or substantially equal to that of the nearest source/drain electrode, here the drain electrode. The selected cell is reset by applying a zero potential difference between its terminals and only this cell is in this configuration, which prevents the other cells sharing the same first and second control lines from being reset.

When a predefined cell is reset, the potential of the first control line and the potential of the second control line are configured so that the potentials applied to the two electrodes of the capacitor are identical or substantially identical. The potential difference between the two control lines is zero or substantially zero for the two lines defining the memory cell to be reset. The potentials applied to the two control lines are configured so as to reduce the amplitude of the first potential barriers with respect to the other cells sharing the same second line control. The potentials applied to the two control lines are configured so as to bring the diode closer to the on-state with respect to the other cells sharing the same first control line. In an advantageous way, the potential of the source electrode is the ground and the potential of the drain electrode is lower than or equal to 0.7V while making sure that the diode remains in an off-state. The variation of potential applied to the drain electrode is identical or substantially identical to the variation applied to the gate electrode in absolute value so that the cells sharing the same drain control line and the cells sharing the same gate control line substantially lose the same quantity of electric charges in the capacitor.

In other words, the control circuit is configured to reset a predefined memory cell advantageously by applying a zero potential difference between the first and second control lines associated with the predefined cell and to decrease the amplitude of the first potential barrier with respect to the other memory cells coupled with the same first control line.

The same holds true when writing a second state into a predefined cell to prevent a first state from being written in the cells sharing the same gate control line. The variation applied to the gate electrode in absolute value is advantageously equal to half of the potential difference applied between the source and drain electrodes to switch the diode into the on-state and to limit the discharge of the capacitors of the other memory cells.

Such a device makes it possible to work in a range of voltages lower than that used for devices of the prior art while having an identical or even a better performance, in particular regarding the programming or reading speed or the duration of holding the data in a simple or matrix configuration.

The invention claimed is:

1. Memory cell comprising:
   a field-effect transistor comprising:
   a first source/drain electrode formed in a film made of a semiconductor material by a first N-doped area,
   a second source/drain electrode formed in the film made of the semiconductor material by a second P-doped area,
   an inter-electrode area formed in the film made of a semiconductor material and separating the two source/drain electrodes,
   a gate electrode covering, at least partially, the inter-electrode area,
   a counter-electrode covering, at least partially, the inter-electrode area and separated from the gate electrode by the film made of the semiconductor material
   a first generator for generating a first potential barrier in the semiconductor film, the first potential barrier being opposed to the passage of charge carriers emitted by the first source/drain electrode,
   a second generator for generating a second potential barrier in the semiconductor film, the second potential barrier being opposed to the passage of charge carriers emitted by the second source/drain electrode, the second potential barrier being shifted from the first potential barrier with respect to an axis linking the two source/drain electrodes, one of the generators being configured so as to generate a potential barrier having a variable amplitude and being electrically connected to the gate electrode, the other generator for generating a potential barrier being electrically connected to the counter-electrode, a circuitry configured for applying a first potential difference between the first source/drain electrode and the second source/drain electrode so as to bias the P-doped electrode at a potential higher than a potential of the N-doped electrode, a control circuit configured so as to:
switch the transistor into an first state then into an off-state in order to write a state into the memory cell by charging a capacitor formed by the gate electrode and the semiconductor film, discharge the capacitor for writing a second state into the memory cell and, apply a higher potential to the P-doped electrode than to the N-doped electrode during a reading phase of the information stored in the memory cell so as to switch the transistor into the on-state when the capacitor is charged.

2. Memory cell according to claim 1, wherein the other generator for generating a potential barrier comprises an covering insulating film configured so as to present electric charges at the interface between the covering insulating film and the semiconductor film or in covering insulating film.

3. Memory cell according to claim 1, wherein the semiconductor film is separated from a support substrate by a electrically insulating film, the gate electrode being separated from the support substrate by the electrically insulating film.

4. Memory cell according to claim 3, wherein the other generator for generating a potential barrier comprises an additional doped area formed in the film made of the semiconductor material, the additional doped area forming a PN or NP junction at the interface with one of the two source/drain electrodes.

5. Memory cell according to claim 4, wherein the semiconductor film comprises two PN or NP diodes mounted in series in the same direction between the first and the second source/drain electrodes.

6. Memory cell according to claim 1, wherein the counter-electrode covers all the inter-electrode area.

7. Memory cell according to claim 1, comprising a circuitry configured to apply a potential difference between the first source/drain electrode and the gate electrode which has the same sign than the potential difference between the first source/drain electrode and the second source/drain electrode.

8. Memory cell according to claim 1, wherein an additional gate electrode electrically dissociated from the gate electrode, the other generator for generating a potential barrier is configured to generate a potential barrier and is electrically connected to the additional gate electrode.

9. Matrix memory comprising:
a plurality of memory cells according to claim 1, the memory cells being arranged in first and second nonparallel directions,
a first control line coupling the gate electrodes of the memory cells arranged in a first direction,
a second control line coupling the adjacent source/drain electrode with the gate electrode of the memory cells arranged in the second direction,
the control circuit is configured to reset a predefined memory cell by applying a zero potential difference between the first and second control lines associated with the predefined cell and to decrease the amplitude of the first potential barrier with respect to the other memory cells coupled with the same first control line.

* * * * *